(12) United States Patent
Li

(10) Patent No.: US 9,294,124 B2
(45) Date of Patent: Mar. 22, 2016

(54) DICTIONARY-BASED COMPRESSION METHOD, DICTIONARY-BASED DECOMPRESSION METHOD AND DICTIONARY COMPOSING METHOD

(71) Applicant: REALTEK SEMICONDUCTOR CORPORATION, Hsinchu (TW)

(72) Inventor: Qiang Li, Suzhou Industrial Park (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/644,647

(22) Filed: Mar. 11, 2015

(65) Prior Publication Data

US 2015/0326247 A1  Nov. 12, 2015

(30) Foreign Application Priority Data

May 7, 2014  (CN) .......................... 2014 1 0190348

(51) Int. Cl.
*H03M 7/00* (2006.01)
*H03M 7/34* (2006.01)
*H03M 7/30* (2006.01)

(52) U.S. Cl.
CPC .................................. *H03M 7/3088* (2013.01)

(58) Field of Classification Search
CPC ... H03M 7/30; H03M 7/3088; H03M 7/3059; H03M 7/3084; H03M 7/40; H03M 7/4006; H03M 7/3062; H03M 7/3086; H03M 7/6023; H03M 7/607; H03M 7/6088
USPC .............................................. 341/106, 51, 50
See application file for complete search history.

(56) References Cited

U.S. PATENT DOCUMENTS

| | | | | |
|---|---|---|---|---|
| 5,373,290 | A * | 12/1994 | Lempel | H03M 7/3088 341/106 |
| 6,529,912 | B2 * | 3/2003 | Satoh | H03M 7/3084 707/693 |
| 7,403,136 | B2 * | 7/2008 | De La Cruz | H03M 7/3084 341/106 |
| 2009/0022413 | A1 * | 1/2009 | Singh | H03M 7/30 382/244 |
| 2009/0079597 | A1 * | 3/2009 | McCanne | H03M 7/30 341/51 |
| 2009/0324111 | A1 * | 12/2009 | Kessels | G03F 7/70508 382/232 |
| 2012/0323929 | A1 * | 12/2012 | Kimura | G06F 17/30339 707/748 |
| 2013/0054543 | A1 * | 2/2013 | Brown | H03M 7/3084 707/693 |
| 2013/0082851 | A1 * | 4/2013 | Pardo | H03M 7/3088 341/106 |
| 2014/0149605 | A1 * | 5/2014 | Annamalaisami | H04L 41/00 709/247 |

OTHER PUBLICATIONS

Yoshihisa Mano et al., A Data Compression Scheme which Achieves Good Compression for Practical Use, IEEE, 1991, pp. 442-449.
Charles Lefurgy et al., Improving Code Density Using Compression Techniques, IEEE, 1997.

* cited by examiner

*Primary Examiner* — Jean B Jeanglaude
(74) *Attorney, Agent, or Firm* — WPAT, P.C.; Anthony King

(57) ABSTRACT

A dictionary-based compression method is disclosed and includes the following steps receiving digital data which include a plurality of data blocks; compressing the digital data according to a multilayer dictionary-based compression algorithm which includes a first, a second and a third dictionary-based compression algorithms. The first, second and third dictionary-based compression algorithms execute compression by a unit range of N data blocks, a unit range of M data blocks and a unit range of L data block(s) respectively, in which N, M, L are integers not greater than the number of the total data blocks. N is greater than M, and M is greater than L.

18 Claims, 13 Drawing Sheets

DICTIONARY-BASED COMPRESSION METHOD, DICTIONARY-BASED DECOMPRESSION METHOD AND DICTIONARY COMPOSING METHOD

BACKGROUND OF THE INVENTION

1. Field of the Invention

The present disclosure relates to compression and decompression techniques, especially to a dictionary-based compression method, a dictionary-based decompression method and a dictionary composing method.

2. Description of Related Art

There are a lot of digital data compression algorithms. Some of them lead to data distortion, but some of them are lossless. Among these algorithms, Lempel-Ziv is a well-known lossless compression algorithm. Many analogous algorithms are derived therefrom, and the main characteristic thereof is using dictionary and dictionary index to replace the original data. For instance, such algorithms may scan the original data, store the unique and repeated contents of the data (e.g., a single symbol or the combination of several symbols) in a dictionary and use a brief code to take the place of the unique contents so as to achieve the purpose of lossless data compression. However, most of the dictionary-based compression algorithms relate to a single-layer dictionary, which means that such algorithm executes dictionary-based compression by a fixed unit range.

In addition, in order to save the instruction set storage size of a micro controller unit (MCU) so as to reduce cost and/or to accelerate the transmission efficiency of an instruction set, it is common to compress the instruction set. Some instruction set compression techniques compress an instruction set and store it in a non-cache memory (e.g., a flash memory or a main DRAM). Such techniques then decompress the compressed instruction set when a cache memory with the instruction set is loaded. However, most of the current instruction set compression techniques (e.g., compression techniques utilizing Huffman Encoding) have at least one of the following problems: the non-constant or unpredictable time for decompression (,which makes it hard to estimate the operation efficiency) and the limited starting point of decompression (i.e., the start of a compressed instruction set or the start of a specific coded block) instead of any coded unit of a coded block (,which reduces the efficiency of decompression).

People who are interested in dictionary-based compression algorithms and instruction set compression techniques may refer to the following documents: Charles Lefurgy, Peter Bird, I-Cheng Chen, Trevor Mudge, "Improving Code Density Using Compression Techniques", Proceedings of Micro-30, Dec. 1-3, 1997; Yoshihisa Mano, Yutaka Sato, "A Data Compression Scheme which Achieves Good Compression for Practical Use", IEEE, 1991.

SUMMARY OF THE INVENTION

An object of the present disclosure is to provide a dictionary-based compression method, a dictionary-based decompression method and a dictionary composing method capable of making an improvement over the prior art.

The present disclosure discloses a dictionary-based compression method. An embodiment of the said method includes the following steps: receiving digital data including a plurality of data blocks, in which each of the data blocks includes a plurality of data units and each of the data units includes a plurality of bits; and compressing the digital data according to a multilayer dictionary-based compression algorithm including a first dictionary-based compression algorithm, a second dictionary-based compression algorithm and a third dictionary-based compression algorithm, in which the first dictionary-based compression algorithm is operable to execute compression to a first content of the digital data by a unit range of N data blocks, the second dictionary-based compression algorithm is operable to execute compression to a second content of the digital data by a unit range of M data blocks and the third dictionary-based compression algorithm is operable to execute compression to a third content of the digital data by a unit range of L data block(s), in which the first, second and third contents are different, each of N, M, L is a positive integer not greater than the number of the plurality of data blocks, N is greater than M, and M is greater than L.

The present disclosure also discloses a dictionary-based compression method operable to compress an instruction set for a micro controller unit (MCU). An embodiment of the said method includes the following steps: receiving the instruction set including a plurality of instruction blocks, in which each of the instruction blocks includes a plurality of data units, and each of the data units includes a plurality of bits; and compressing the instruction set according to a plurality of dictionary-based compression algorithms including a first dictionary-based compression algorithm and a second dictionary-based compression algorithm, in which the first dictionary-based compression algorithm is operable to execute compression to a first content of the instruction set by a unit range of N instruction blocks and the second dictionary-based compression algorithm is operable to execute compression to a second content of the instruction set by a unit range of M instruction block(s), in which the first and second contents are different, each of N and M is a positive integer not greater than the number of the plurality of instruction blocks, and N is greater than M.

The present disclosure further discloses a dictionary-based decompression method operable to generate digital data through decompression. An embodiment of this method includes the following steps: receiving a first shift number; locating a first coded unit according to the first shift number; determining a dictionary start address according to the first coded unit pertaining to a plurality of coded units which are associated with at least three dictionary-based compression algorithms; determining a dictionary content address according to a plurality of parameters including the first coded unit and the dictionary start address; and accessing a memory according to the dictionary content address to obtain one or more first data units in connection with the first coded unit, in which the one or more first data units pertains to the digital data.

The present disclosure also discloses a dictionary-based decompression method operable to generate an instruction set of an MCU through decompression. An embodiment of this method includes the following steps: receiving a first program counter value; locating a first coded unit according to the first program counter value, in which the first coded unit pertains to a plurality of coded units that are associated with a plurality of dictionary-based compression algorithms; determining a dictionary start address according to the first coded unit; determining a dictionary content address according to a plurality of parameters including the first coded unit and the dictionary start address; and accessing a memory according to the dictionary content address to obtain one or more first data units in connection with the first coded unit, in which the one or more first data units pertains to the instruction set of the micro controller unit.

The present disclosure further discloses a dictionary composing method for digital data compression or decompression. An embodiment of the said method comprises: generating an analysis result by analyzing the data composition and/or compression rate of digital data according to a plurality of dictionary-based compression algorithms, in which the digital data include a plurality of data blocks, each of the data blocks includes a plurality of data units and each of the data units includes a plurality of bits; and generating at least three dictionaries including a first dictionary, a second dictionary and a third dictionary according to the analysis result, in which the first, second and third dictionaries are associated with a first dictionary-based compression algorithm, a second dictionary-based compression algorithm and a third dictionary-based compression algorithm respectively, the first dictionary-based compression algorithm is operable to execute compression to a first content of the digital data by a unit range of N data blocks, the second dictionary-based compression algorithm is operable to execute compression to a second content of the digital data by a unit range of M data blocks and the third dictionary-based compression algorithm is operable to execute compression to a third content of the digital data by a unit range of L data block(s), in which the first, second and third contents are different, each of N, M, L is a positive integer not greater than the number of the plurality of data blocks, N is greater than the M, and M is greater than L.

The present disclosure also discloses a dictionary composing method for MCU instruction set compression or decompression. An embodiment of this method comprises: generating an analysis result by analyzing the data composition and/or compression rate of an instruction set according to a plurality of dictionary-based compression algorithms, in which the instruction set includes a plurality of instruction blocks, each of the instruction blocks includes a plurality of data units and each of the data units includes a plurality of bits; and generating a plurality of dictionaries including a first dictionary and a second dictionary according to the analysis result, in which the first and second dictionaries are associated with a first dictionary-based compression algorithm and a second dictionary-based compression algorithm respectively, the first dictionary-based compression algorithm is operable to execute compression to a first content of the digital data by a unit range of N data blocks and the second dictionary-based compression algorithm is operable to execute compression to a second content of the digital data by a unit range of M data block(s), in which the first and second contents are different, each of N, M is a positive integer not greater than the number of the plurality of data blocks, and N is greater than M.

These and other objectives of the present disclosure no doubt becomes obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms of this technical field. If any term is defined in this specification, such term should be explained accordingly.

Figure 1:
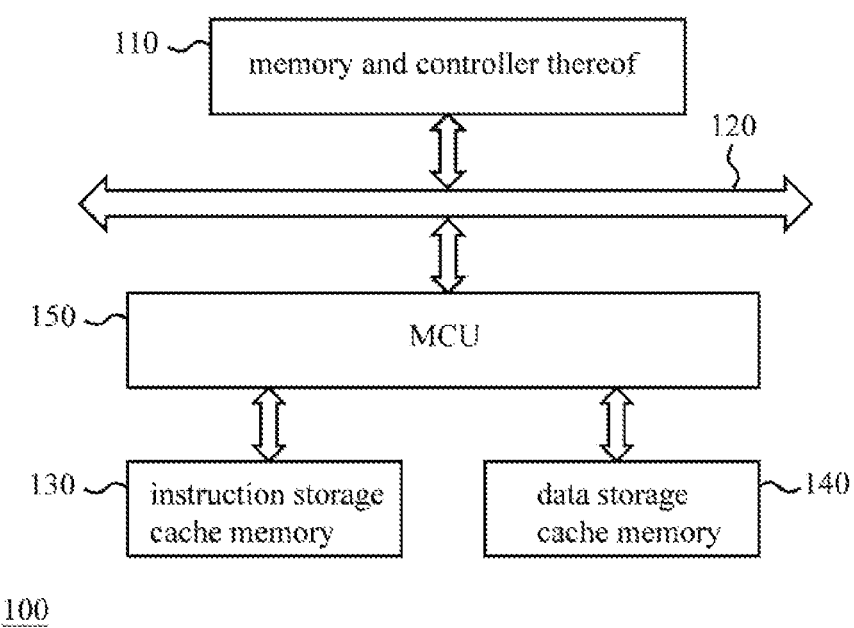
FIG. 1 illustrates a configuration of a micro controller unit.
Figure 2:
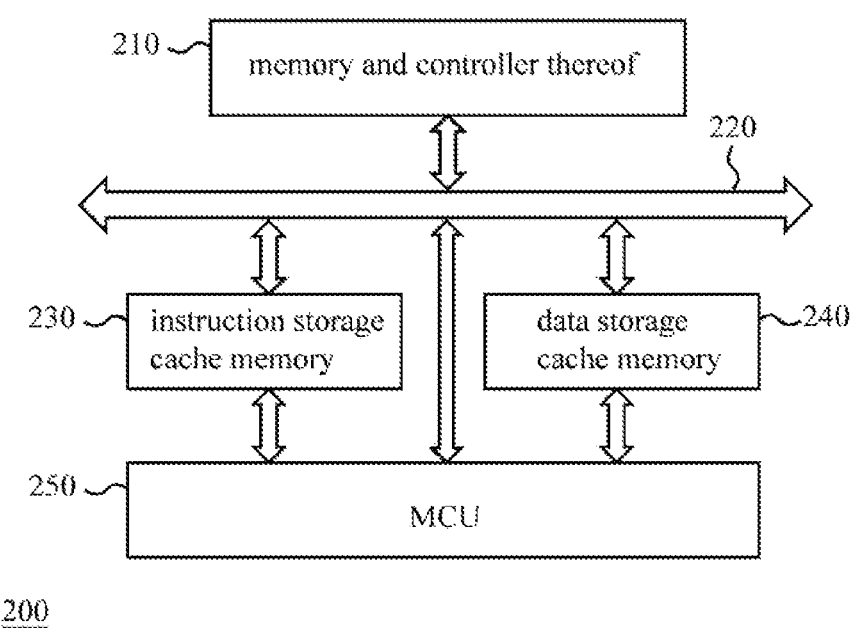
FIG. 2 illustrates another configuration of a micro controller unit.
Figure 4:
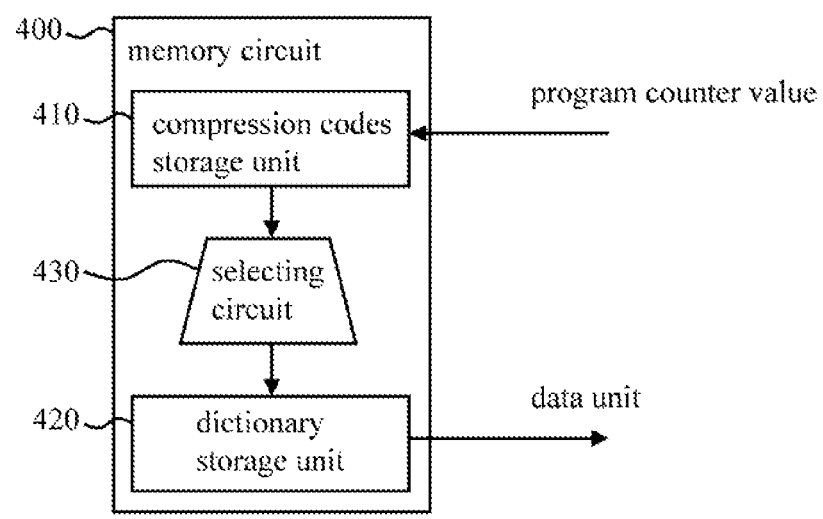
FIG. 4 illustrates an embodiment of the memory circuit storing the compression result of the present disclosure.

The present disclosure includes a dictionary-based compression method, a dictionary-based decompression method and a dictionary composing method. These methods are applicable to digital data (e.g., an instruction set of a micro controller unit (MCU)) compression or decompression without distortion, which reduces the memory size for storing data to reduce cost and can start executing decompression from any unit of compressed data. That is, a user is allowed to estimate the time for decompression accurately. The present disclosure could be implemented with a storage circuit (e.g., the memory circuit 400 of FIG. 4) or an end product (e.g., an electronic product including the said storage circuit). Provided that an alternative means is available and reasonable, people of ordinary skill in the art can use such means similar or equivalent to that described in this specification to carry out the present disclosure. The methods of the present disclosure could be in the form of software and/or firmware and be executed by a general MCU configuration (e.g., the MCU configurations 100, 200 of FIG. 1 and FIG. 2 including: the memory and the controllers 110, 210; the system buses 120, 220; the instruction storage cache memory 130, 230; the data storage cache memory 140, 240; and the MCUs 150, 250) or the equivalent thereof. In other words, the present disclosure can be carried out without changing the configuration of a general MCU or its equivalent. It should be noted that if an implementation derived from at least one of the following embodiments is practicable, a person of ordinary skill in the art can selectively make use of some or all of the features in one embodiment or selectively make use of the combination of some or all features in several embodiments to have the implementation come true so as to increase the flexibility of carrying out the present disclosure.

In order to help readers understand the present disclosure, a cursory example of the present disclosure is first presented. The example includes the following steps:

(1) receiving or generating digital data; for instance, a source code to generate the instruction for an MCU;

(2) analyzing the digital data to generate a multilayer dictionary, which means that the data units of the digital data are categorized and stored in the multilayer dictionary;

(3) using compression codes and the multilayer dictionary to take the place of the digital data, so as to reduce the storage size; and (4) locating a coded unit of the compression codes according to a shift number (e.g., a program counter value or the like) and looking one or several corresponding data units in the multilayer dictionary according to the coded unit (the step in the decompression process).

With the example mentioned above, the detailed embodiments of the present disclosure are further described in the following paragraphs.

Figure 3:
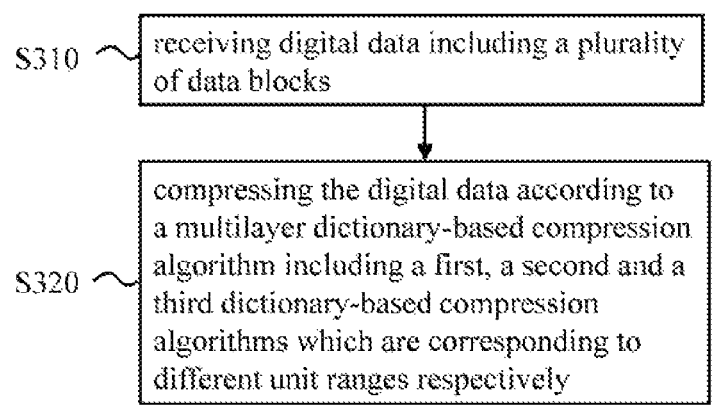
FIG. 3 illustrates an embodiment of the dictionary-based compression method of the present disclosure.

FIG. 3 illustrates an embodiment of the dictionary-based compression method of the present disclosure. As shown in FIG. 3, this embodiment comprises the following steps:

Step S310: receiving digital data including a plurality of data blocks (or capable of being divided into a plurality of data blocks), in which each of the data blocks includes a plurality of data units, and each of the data units includes a plurality of bits.

Step S320: compressing the digital data according to a multilayer dictionary-based compression algorithm including a first dictionary-based compression algorithm, a second dictionary-based compression algorithm and a third dictionary-based compression algorithm, in which the first dictionary-based compression algorithm is operable to execute compression to a first content of the digital data by a unit range of N data blocks, the second dictionary-based compression algorithm is operable to execute compression to a second content of the digital data by a unit range of M data blocks, and the third dictionary-based compression algorithm is operable to execute compression to a third content of the digital data by a unit range of L data block(s) in which the first, second and third contents are different, each of N, M, L is a positive integer not greater than the number of the plurality of data blocks, N is greater than the M, and M is greater than L.

For instance, the first dictionary-based compression algorithm is a global dictionary-based compression algorithm, the second dictionary-based compression algorithm is an intermediate dictionary-based compression algorithm, and the third dictionary-based compression algorithm is a local dictionary-based compression algorithm. More specifically, in this instance, N is equal to the number of the plurality of data blocks, M is less than N but greater than 1, and L is 1.

For another instance, the first dictionary-based compression algorithm is operable to process at least one of the data units (e.g., the data unit X in Table 1) whose occurrence frequency is equal to or higher than a first frequency (e.g., the highest frequency or a predetermined frequency) when one data block is taken as a unit range over all of the data blocks. The second dictionary-based compression algorithm is operable to process at least one of the data units (e.g., the data units Y, Z in Table 1) whose occurrence frequency is between the first frequency and a second frequency when one data block is taken as a unit range over all of the data blocks. The third dictionary-based compression algorithm is operable to process at least one of the data units (e.g., the data units A, B, C, D in Table 1) whose occurrence frequency is lower than the second frequency when one data block is taken as a unit range over all of the data blocks, in which the third dictionary-based compression algorithm in this instance is aimed at processing at least one of the data units (e.g., the data units A, B, C, D in Table 1) whose occurrence frequency is the highest within the same data block. In addition, the compressed digital data (i.e., the compression codes and the dictionary) can be stored in a memory circuit such as the memory circuit 400 in FIG. 4. The memory circuit includes a compression codes storage unit 410 operable to store the compression codes (as known as indices) in connection with the digital data and to output a coded unit of the compression codes according to a shift number (e.g., a program counter value), a dictionary storage unit 420 operable to store the data units in connection with the compression codes, and a selecting circuit 430 operable to make the dictionary storage unit 420 output a corresponding data unit according to the coded unit.

Figure 5A:
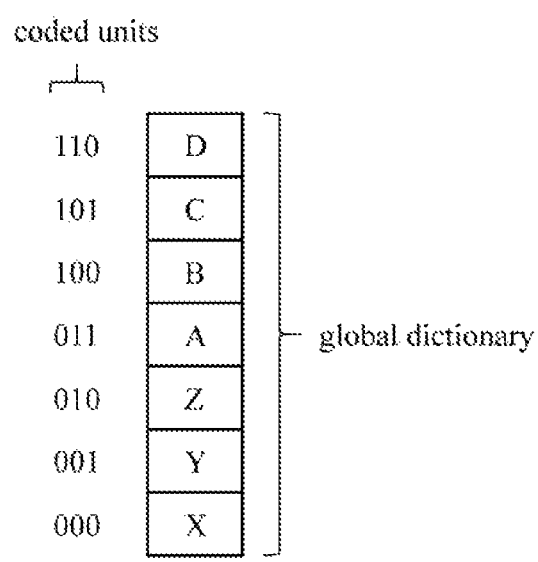
FIG. 5a illustrates the compression result generated through a global dictionary.
Figure 5B:
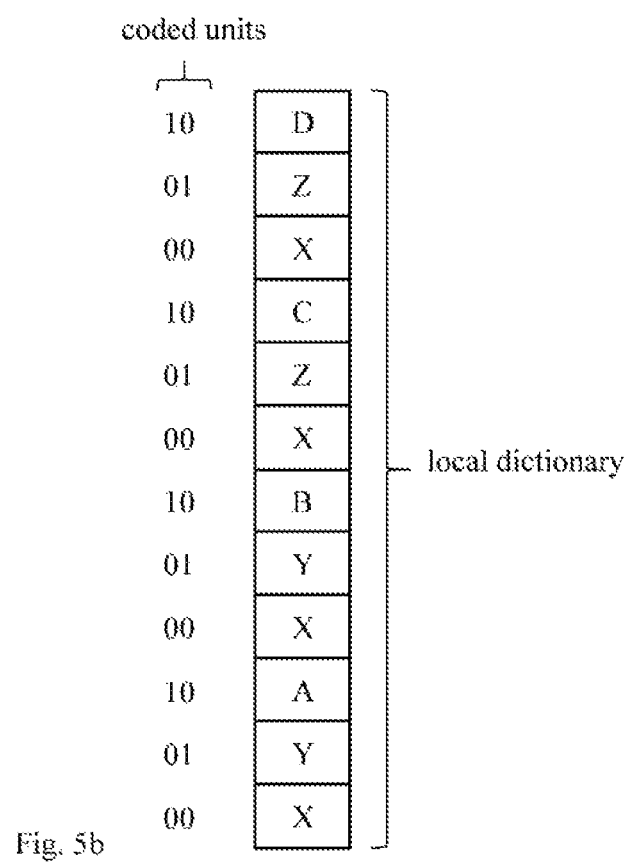
FIG. 5b illustrates the compression result generated through a local dictionary.
Figure 5C:
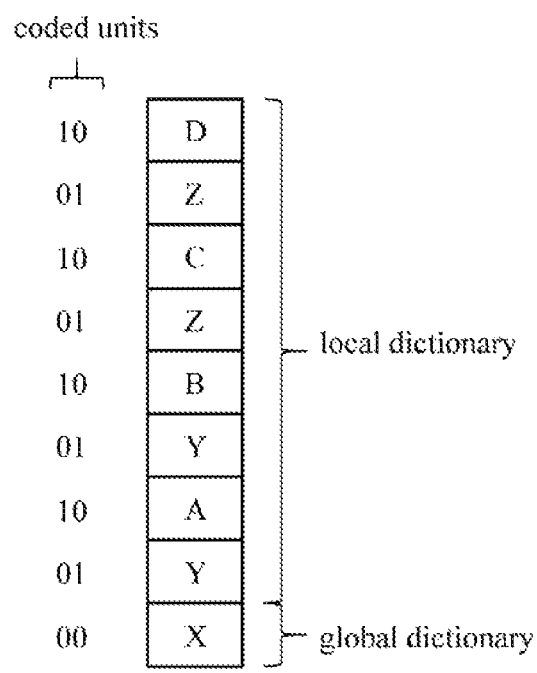
FIG. 5c illustrates the compression result generated through a global dictionary and a local dictionary.
Figure 5D:
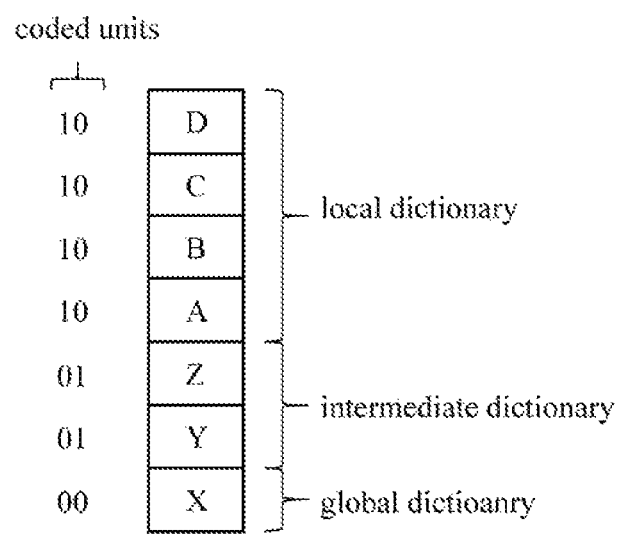
FIG. 5d illustrates the compression result generated through a multilayer dictionary.

In light of the above, here is a further explanation with specific numbers. Reference is made to Table 1. Table 1 includes digital data "AAXYBBXYCCXZDDXZ" which include (or, it can be said, is divided into) a plurality of data blocks: "AAXY" containing data units "A, A, X, Y", "BBXY" containing data units "B, B, X, Y", "CCXZ" containing data units "C, C, X, Z", and "DDXZ" containing data units "D, D, X, Z". Each of the data units includes a plurality of bits (e.g., 32 bits in this example). Therefore, the original storage required for storing the digital data is 16×32 bits. The data unit X that appears in each of the data blocks could be treated as the first piece of data in a single dictionary (as shown in FIG. 5a or FIG. 5b) or the data of a first dictionary (or first layer) among different dictionaries (as shown in FIG. 5c or FIG. 5d). The data unit Y that appears in the first two data blocks and the data unit Z that appears in the last two data blocks can be treated as two pieces of data in a single dictionary (as shown in FIG. 5a or FIG. 5b) or in the data of a second dictionary (or second layer) among different dictionaries (as shown in FIG. 5c or FIG. 5d). The data units A, B, C and D, each of which appears in only one of the data blocks, can be treated as four pieces of data in a single dictionary (as shown in FIG. 5a or FIG. 5b) or as data in a third dictionary (or third layer) among different dictionaries (as shown in FIG. 5c or FIG. 5d). Accordingly, if the first, second and third dictionary-based compression algorithms of Step S320 are a global, an intermediate and a local dictionary-based compression algorithms respectively, there exists at least the following compression cases (also shown in Table 1): exist:

(1) The case of merely using the global dictionary-based compression algorithm for compression:

Reference is made to FIG. 5. In this scenario, the global dictionary-based compression algorithm takes N data blocks (four data blocks, i.e., the total data blocks, in the present case) as a unit range, stores unique data units X, Y, Z, A, B, C, D of each unit range in a global dictionary (which could be divided into seven units as shown in FIG. 5a in the present case) and compresses the digital data "AAXYBBXYCCXZDDXZ" as follows: 011, 011, 000, 001; 100, 100, 000, 001; 101, 101, 000, 010; 110, 110, 000, 010 (in which 000 represents X, 001 represents Y, 010 represents Z, 011 represents A, 100 represents B, 101 represents C, 110 represents D, and this representation is merely exemplary and could be modified by those utilizing the present disclosure). Consequently, since each 32-bit data unit is represented by a 3 bits coded unit, in which seven unique 32-bit data units are stored in the global dictionary, the storage size for storing the compressed digital data is 3×16+7×32 bits that is less than the original storage size 16×32 bits.

It should be noted that only the global dictionary-based compression algorithm is used in this scenario, and different data units are associated with different coded units respectively. Therefore, during decompression, the present scenario can locate a wanted coded unit (e.g., the coded unit 010 in connection with a program counter value 12) according to a shift number (e.g., the said program counter value, such as 12, for indicating the serial number of the wanted data unit), find out a corresponding dictionary content address according to the value of the coded unit and the global dictionary start address, and thereby obtain the data unit (e.g., the data unit Z in connection with the coded unit 010) stored by the dictionary content address. More specifically, an example of determining the dictionary content address is expressed as follows:

"Dictionary content address=Global dictionary start address (e.g., a predetermined address 0)+coded unit"

(2) The case of merely using the local dictionary-based compression algorithm for compression:

Reference is made to FIG. 5b. In this scenario, the local dictionary-based compression algorithm takes L data blocks (one data block in the present case) as a unit range, stores unique data units "X, Y, A", "X, Y, B", "X, Z C", "X, Z, D" of each unit range in a local dictionary (which could be divided into twelve units as shown in FIG. 5b in the present case), and compresses the digital data "AAXYBBXYCCXZDDXZ" as follows: 10, 10, 00, 01; 10, 10, 00, 01; 10, 10, 00, 01; 10, 10, 00, 01 (,in which 00 represents X of the aforementioned four data blocks, 01 represents Y of the first two data blocks and Z of the last two data blocks, 10 represents A, B, C, D of the four data blocks, and this representation is merely exemplary and could be modified by those utilizing the present disclosure). As a result, since each 32-bit data unit is represented by a 2-bit coded unit and each unit range (i.e., one data block) contains three unique 32-bit data units, the storage size for storing the compressed digital data is (2×4+3×32)×4=13×32 bits which is less than the original storage size 16×32 bits but greater than the storage size 3×16+7×32 bits when the global dictionary-based algorithm is adopted.

It should be noted that in this scenario only the local dictionary-based compression algorithm is used. Therefore, during decompression, the present scenario can locate a wanted coded unit (e.g., the coded unit 01 in connection with a program counter value 8) according to a shift number (e.g., the said program counter value such as 8), and find out a corresponding dictionary content address according to the shift number, the value of the coded unit and the local dictionary start address, and thereby obtain the data unit (e.g., the data unit Y in connection with the program counter value 8 and the coded unit 01) corresponding to the coded unit. More specifically, an example of determining the dictionary content address is expressed as follows:

"Dictionary content address=Local dictionary start address (e.g., a predetermined address or a functional value of the program counter value)+coded unit (or, it can be said, the dictionary address arrangement order of this coded unit)"

(3) The case of using the global and local dictionary-based compression algorithms for compression:

Reference is made to FIG. 5c. In this scenario, the global dictionary-based compression algorithm is operable to compress the repeated content X in each global unit range (i.e., the total four data blocks) and consumes the dictionary storage size 1+32 bits; the local dictionary-based compression algorithm is operable to compress the contents other than X (i.e., "Y, A", "Y, B", "Z, C", "Z, D") in each local unit rage (i.e., one data block) and consumes the storage size 8×32 bits; meanwhile, the global and local dictionaries (which could be divided into 8 units as shown in FIG. 5c) consume the storage size 1×32+8×32=9×32 bits. Accordingly, the two dictionary-based compression algorithms compress the digital data "AAXYBBXYCCXZDDXZ" as follows: 10, 10, 00, 01; 10, 10, 00, 01; 10, 10, 00, 01; 10, 10, 00, 01 (,in which 00 represents the repeated content X, 01 represents Y of the first two data blocks and Z of the last two data blocks, 10 represents A, B, C, D of the four data blocks, and this representation is merely exemplary and could be modified by those utilizing the present disclosure). As a result, since each 32-bit data unit is represented by a 2-bit coded unit and all dictionaries consume the storage size 9×32 bits, the storage size for storing the compressed digital data is (2×4+2×32)×4+1×32=10×32 bits which is less than the original storage size 16×32 bits, also less than the storage size 13×32 bits when only the local dictionary-based compression algorithm is adopted, but greater than the storage size 3×16+7×32 bits when the global dictionary-based algorithm is adopted.

It should be noted that in this scenario a two-layer dictionary-based compression algorithm is used. Therefore, during decompression, the present scenario can locate a wanted coded unit (e.g., the coded unit 10 in connection with a program counter value 6) according to a shift number (e.g., the said program counter value such as 6), determine that the coded unit is associated with the global dictionary or the local dictionary according to the coded unit and the minimum coded value of the local dictionary (e.g., determine that the content corresponding to the coded unit 10 is stored in the local dictionary because the coded unit 10 is greater than the minimum coded value 01 of the local dictionary), then find out a corresponding dictionary content address according to a plurality of parameters, and thereby obtain the data unit corresponding to the coded unit. An example of determining the dictionary content address is expressed as follows (when coded unit 10 is taken for example):

"Dictionary content address=Local dictionary start address+(shift number/the data block size in association with the local dictionary)×(the coded block size in association of the local dictionary)+ (coded unit−the minimum coded value of the global dictionary)"

It should be further noted that the start address (abbreviation: layer_mem_start) of each dictionary (while the bottom layer dictionary might be ignored if practicable), the minimum coded value (abbreviation: layer_code_start), the size of the concerned data block (that is to say, the number of data units contained therein; abbreviation: layer_data_blksize), and etc. could be stored in one or more memory units (e.g., registers). Because the number of the memory units is limited, the overall compression rate is not substantially affected.

(4) The case of using a multilayer dictionary-based compression algorithm for compression:

Reference is made to FIG. 5d. In this scenario, the global dictionary-based compression algorithm is operable to compress the repeated content X in each global unit range (i.e., the total four data blocks) and to consume the dictionary storage size 1×32 bits; the aforementioned intermediate dictionary-based compression algorithm is operable to compress the repeated contents Y, Z in each intermediate unit range (i.e., two data blocks) and consumes the dictionary storage size 2×32 bits; and the local dictionary-based compression algorithm is operable to compress the repeated contents A, B, C, D in each local unit range (i.e., one data block) and to consume the dictionary storage size 1×32+2×32+4×32=7×32 bits. Therefore, the multiplayer dictionary-based compression algorithm is operable to compress the digital data "AAXYBBXYCCXZDDXZ" as follows: 10, 10, 00, 01; 10, 10, 00, 01; 10, 10, 00, 01; 10, 10, 00, 01 (,in which 00 represents the repeated content X of the four data blocks, 01 represents Y of the first two data blocks and Z of the last two data blocks, 10 represents A, B, C, D of the four data blocks, and this representation is merely exemplary and could be modified by those utilizing the present disclosure). As a result, since each 32-bit data unit is represented by a 2-bit coded unit and all dictionaries consume the storage size 7×32 bits, the storage size for storing the compressed digital data is 2×16+7×32=8×32 bits which is less than the original storage size 16×32 bits, and also less than any of the storage sizes required by the fore-illustrated scenarios. In brief, executing compression to the mentioned digital data with the multilayer dictionary-based compression algorithm is able to achieve the best compression rate.

It should be noted that in this scenario a multilayer dictionary-based compression algorithm is used. Therefore, during decompression, the present scenario can locate a wanted coded unit (e.g., the coded unit 10 in connection with a program counter value 5) according to a shift number (e.g., the said program counter value such as 5), determine whether the coded unit is associated with the local dictionary (e.g., determine that the content corresponding to the coded unit 10 is stored in the local dictionary if the coded unit 10 is found to be equal to or greater than the minimum coded value 10 of the local dictionary), determine that the coded unit is associated with the content stored in the intermediate or global dictionary according to the coded unit and the minimum coded value (i.e., 01 in the present case) of the intermediate dictionary that is the next layer (i.e., the second layer) if the coded unit is not associated with the local dictionary, then find out a corresponding dictionary content address according to a plurality of parameters, and thereby obtain the data unit corresponding to the coded unit. An example of determining the dictionary content address is expressed as follows (when coded unit 10 is taken for example):

"Dictionary content address=Local dictionary start address+(shift number/the data block size in association with the local dictionary)×(the coded block size in association of the local dictionary)+ (coded unit−the minimum coded value of the intermediate dictionary)"

Similarly, the start address of each dictionary (while the bottom dictionary could be excluded if practicable), the minimum coded value, the size of the corresponding data block, the size of the corresponding coded block, and etc. can be stored in one or more memory units.

TABLE 1

| Digital data (16 × 32 bits) | AAXYBBXYCCXZDDXZ |
|---|---|
| Data blocks | AAXY BBXY CCXZ DDXZ |
| Scenario of merely using global dictionary-based compression | |
| Contents stored in global dictionary | XYZABCD |
| Contents compressed with global dictionary | 011, 011, 000, 001; 100, 100, 000, 001; 101, 101, 000, 010; 110, 110, 000, 010 |
| Storage size required for global dictionary-based compression | 3 × 16 + 7 × 32 bits |

TABLE 1-continued

| Scenario of merely using local dictionary-based compression | |
|---|---|
| Contents stored in local dictionary | XYAXYBXZCXZD |
| Contents compressed with local dictionary | 10, 10, 00, 01; 10, 10, 00, 01; 10, 10, 00, 01; 10, 10, 00, 01 |
| Storage size required for local dictionary-based compression | 13 × 32 bits |
| Scenario of using global and local dictionary-based compression | |
| Contents stored in global dictionary | X |
| Contents stored in local dictionary | YAYBZCZD |
| Contents compressed with global and local dictionaries | 10, 10, 00, 01; 10, 10, 00, 01; 10, 10, 00, 01; 10, 10, 00, 01 |
| Storage size required for global and local dictionary-based compression | 10 × 32 bits |
| Scenario of using multilayer dictionary-based compression | |
| Contents stored in global dictionary | X |
| Contents stored in intermediate dictionary | YZ |
| Contents stored in local dictionary | ABCD |
| Contents compressed with multilayer dictionary | 10, 10, 00, 01; 10, 10, 00, 01; 10, 10, 00, 01; 10, 10, 00, 01 |
| Storage size required for multilayer dictionary-based compression | 8 × 32 bits |

P.S. The blank space and punctuation marks are merely for illustration and are not effective contents in the present case.

In the above four scenarios, the scenario of using a multilayer dictionary-based compression algorithm is able to achieve the best compression rate. Although it is possible to achieve the best compression rate by using a single-layer or a double-layer dictionary-based compression algorithm for some digital data with specific patterns, the present embodiment focuses on the multilayer (at least three layers) dictionary-based compression algorithm. In addition, one data block of the digital data of this embodiment includes four data units; however, this is merely exemplary, and the present method can determine the number of data units of a data block according to a predetermined rule or to a data composition analysis result. Furthermore, people of ordinary skill in the art can derive a compression process using more layers, adopt a different relationship between coded units and data units, and/or increase/decrease the number of bits of a coded unit from the disclosure (e.g., the aforementioned four scenarios) of this specification. Such modifications and the like are included in the scope of the present disclosure.

It should be noted that, as it is shown in FIG. 5d, the four scenarios in Table 1 make the global dictionary the bottom layer (to store the data unit X) among all the dictionaries, make the intermediate dictionary the intermediate layer (to store the data units Y, Z) among all the dictionaries, and make the local dictionary the top layer (to store data units A, B, C, D) among all the dictionaries. This layer arrangement is merely exemplary. The present disclosure is characterized by the number of dictionary layers and not limited to any dictionary arrangement order. For instance, the order of the mentioned three dictionaries can be altered arbitrarily. However, in order to access dictionary conveniently, the embodiments of the present disclosure store the data units that are associated with the same dictionary by successive addresses so as to ascertain the start address of the same dictionary.

The present disclosure also discloses a dictionary-based compression method dedicated to the compression of an MCU instruction set. An embodiment of the said method is illustrated with FIG. 6, comprising:

Step S610: receiving an instruction set including a plurality of instruction blocks (or capable of being divided into a plurality of instruction blocks), in which each of the instruction blocks includes a plurality of data units and each of the data units includes a plurality of bits.

Step S620: compressing the instruction set according to a plurality of dictionary-based compression algorithms including a first dictionary-based compression algorithm and a second dictionary-based compression algorithm, in which the first dictionary-based compression algorithm is operable to execute compression to a first content of the instruction set by a unit range of N instruction blocks and the second dictionary-based compression algorithm is operable to execute compression to a second content of the instruction set by a unit range of M instruction block(s), in which the first and second contents are different, each of N, M is a positive integer not greater than the number of the plurality of instruction blocks and N is greater than M.

For example, N is equal to the number of the plurality of instruction blocks, in which M is less than the N. For another example, the first dictionary-based compression algorithm is operable to process at least one of the data units (e.g., the data unit X in Table 1) whose occurrence frequency is higher than a first frequency when one instruction block is taken as a unit range over all of the instruction blocks, and the second dictionary-based compression algorithm is operable to process at least one of the data units (e.g., the data units Y, Z, A, B, C, D in Table 1) whose occurrence frequency is relatively lower when one instruction block is taken as a unit range over all of the instruction blocks.

The dictionary-based compression algorithms of the present embodiment, similar to those of the embodiment illustrated with FIG. 3, may further include a third dictionary-based compression algorithm executing compression to a third content of the instruction set by a unit range of L instruction blocks, in which the first, second and third contents are different, L is a positive integer not greater than the number of the plurality of instruction blocks, and L is less than M. For instance, N is equal to the number of the plurality of instruction blocks, M is less than N but greater than 1, and L is 1. For another instance, the first dictionary-based compression algorithm is operable to process at least one of the data units (e.g., the data unit X in Table 1) whose occurrence frequency is higher than a first frequency when one instruction block is taken as a unit range over all of the instruction blocks, the second dictionary-based compression algorithm is operable to process at least one of the data units (e.g., the data units Y, Z in Table 1) whose occurrence frequency is between the first frequency and a second frequency when one instruction block is taken as a unit range over all of the instruction blocks, and the third dictionary-based compression algorithm is operable to process at least one of the data units (e.g., the data units A, B, C, D in Table 1) whose occurrence frequency is lower than the second frequency when one instruction block is taken as a unit range over all of the instruction blocks. In addition, in order to execute compression to an unanalyzed instruction set or an instruction set without correlative dictionaries, the present embodiment may further comprise another step: generating an analysis result by analyzing the data composition and/or compression rate of the instruction set according to the plurality of the dictionary-based compression algorithms. In the meantime, the step S620 further includes: compressing the instruction set with the plurality of dictionary-based compression algorithms according to the analysis result.

Figure 6:
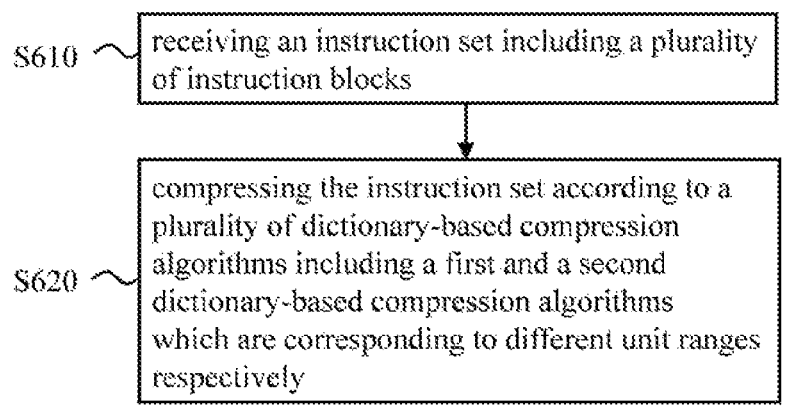
FIG. 6 illustrates an embodiment of the dictionary-based compression method of the present disclosure operable to compress an instruction set.

More of the implementation detail and modification of the embodiment of FIG. 6 can be derived from the description of the embodiment of FIG. 3.

Figure 7:
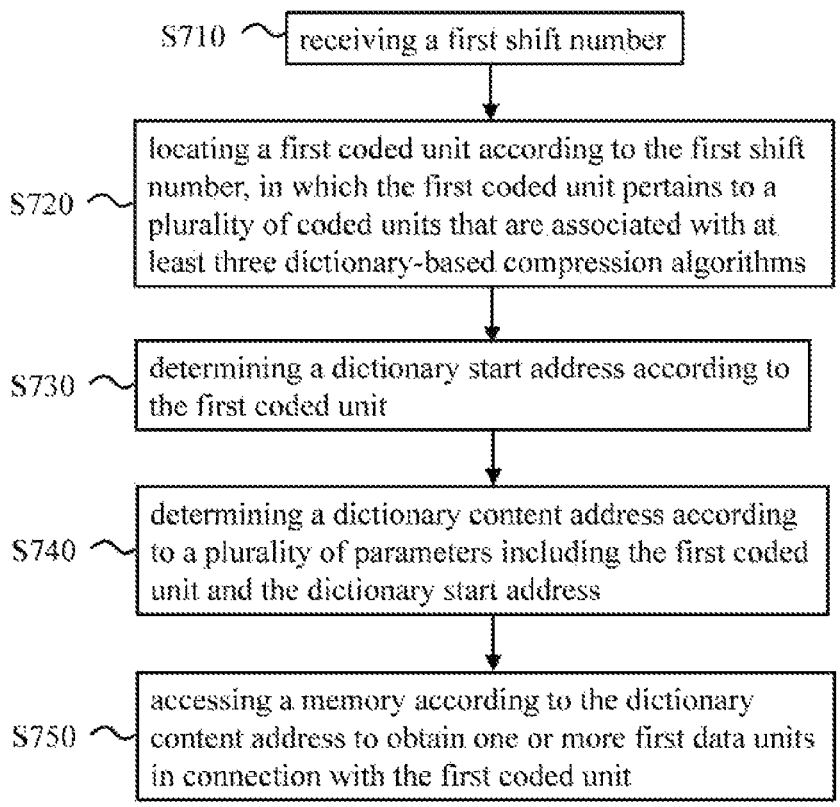
FIG. 7 illustrates an embodiment of the dictionary-based decompression method of the present disclosure.

In addition to the above-described compression methods, the present disclosure further discloses a dictionary-based decompression method operable to generate digital data through decompression and applicable to processing the compression codes generated through the embodiment of FIG. 3. As it is shown in FIG. 7, An embodiment of this decompression method comprises:

Step S710: receiving a first shift number (e.g., a first program counter value).

Step S720: locating a first coded unit according to the first shift number, in which the first coded unit pertains to a plurality of coded units that are associated with at least three dictionary-based compression algorithms. In this embodiment, the number of bits of each coded unit is the same. Compared with this embodiment, using coded units, each of which has different number of bits, to indicate digital data is widely appreciated in this technical field. However, those utilizing the present disclosure can appreciate how to regulate the variation of the bit numbers of coded units according to the present disclosure.

Step S730: determining a dictionary start address according to the first coded unit. The detail explanation could be found through the description about the aforementioned Table 1.

Step S740: determining a dictionary content address according to a plurality of parameters including the first coded unit and the dictionary start address. For instance, the plurality of parameters include the dictionary start address, the first shift number, the size of the data block associated with the first coded unit, the size of the coded block containing the first coded unit, and the dictionary content address. The detail explanation could be found through the description about the aforementioned Table 1.

Step S750: accessing a memory according to the dictionary content address to obtain one or more first data units in connection with the first coded unit in which the one or more first data units pertains to the digital data, the aforementioned dictionary start address is associated with one of at least three dictionaries, and the at least three dictionaries correspond to the aforementioned at least three dictionary-based compression algorithms.

For instance, the at least three dictionary-based compression algorithms include a first dictionary-based compression algorithm, a second dictionary-based compression algorithm and a third dictionary-based compression algorithm, in which the first dictionary-based compression algorithm is operable to execute compression to a first content of the digital data by a unit range of N data blocks, the second dictionary-based compression algorithm is operable to execute compression to a second content of the digital data by a unit range of M data blocks and the third dictionary-based compression algorithm is operable to execute compression to a third content of the digital data by a unit range of L data block(s). The first, second and third contents are different, each of N, M, L is a positive integer not greater than the number of the plurality of data blocks, N is greater than the M, and M is greater than L. The detail explanation could be found through the description about the aforementioned Table 1.

Figure 8:
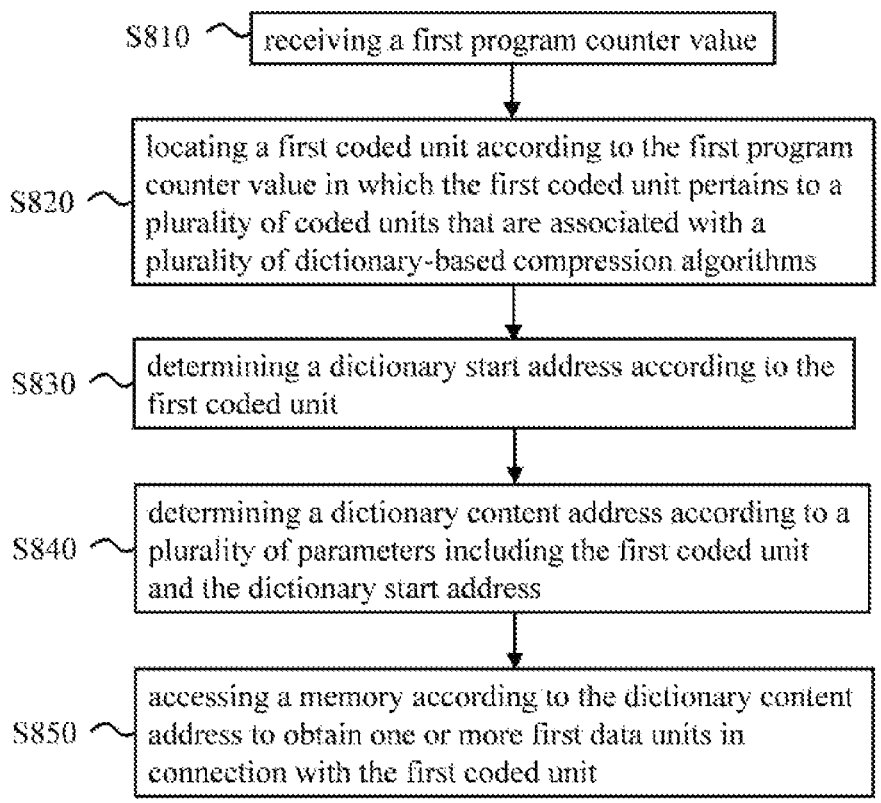
FIG. 8 illustrates an embodiment of the dictionary-based decompression method of the present disclosure operable to decompress an instruction set.

The present disclosure also discloses a dictionary-based decompression method operable to decompress a compressed instruction set of an MCU. An embodiment of this method is illustrated with FIG. 8 and comprises:

Step S810: receiving a first program counter value.

Step S820: locating a first coded unit according to the first program counter value in which the first coded unit pertains to a plurality of coded units that are associated with a plurality of dictionary-based compression algorithms. In this embodiment, the number of bits of each coded unit is the same.

Step S830: determining a dictionary start address according to the first coded unit. The detail explanation could be found through the description about the aforementioned Table 1.

Step S840: determining a dictionary content address according to a plurality of parameters including the first coded unit and the dictionary start address. For instance, the plurality of parameters include the dictionary start address, the first program counter value, the size of the block associated with the first coded unit, the size of the coded block containing the first coded unit, and the dictionary content address. The detail explanation could be found through the description about the aforementioned Table 1.

Step S850: accessing a memory according to the dictionary content address to obtain one or more first data units in connection with the first coded unit in which the one or more first data units pertains to the instruction set of the micro controller unit, the mentioned dictionary start address is associated with one of a plurality of dictionaries which correspond to the said dictionary-based compression algorithms respectively. For instance, provided that the instruction set includes a plurality of instruction blocks, the plurality of dictionary-based compression algorithms includes a first dictionary-based compression algorithm and a second dictionary-based compression algorithm, in which the first dictionary-based compression algorithm is operable to execute compression to a first content of the instruction set by a unit range of N data blocks and the second dictionary-based compression algorithm is operable to execute compression to a second content of the instruction set by a unit range of M data block(s), in which the first and second contents are different, each of N and M is a positive integer not greater than the number of the plurality of instruction blocks, and N is greater than M. The detail explanation could be found through the description about the aforementioned Table 1.

Figure 9:
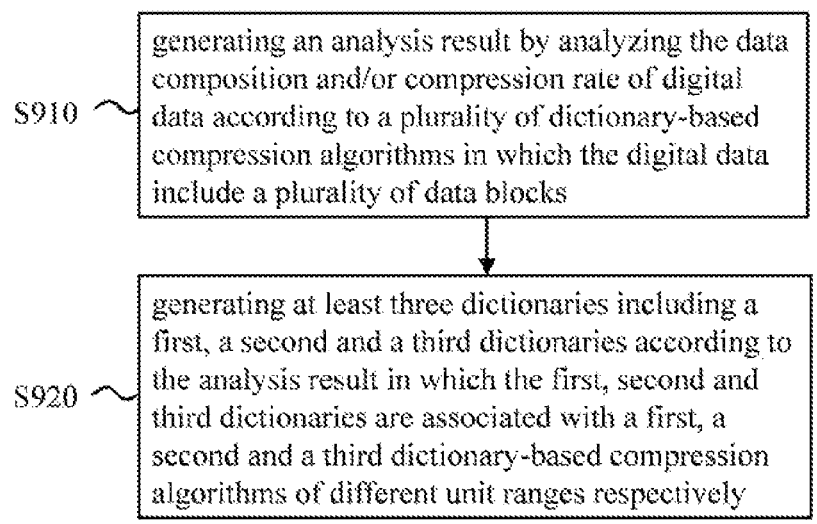
FIG. 9 illustrates an embodiment of the dictionary composing method of the present disclosure.

The present disclosure further discloses a dictionary composing method for digital data compression or decompression. As shown in FIG. 9, an embodiment of the said method comprises:

Step S910: generating an analysis result by analyzing the data composition and/or compression rate of digital data according to a plurality of dictionary-based compression algorithms in which the digital data include a plurality of data blocks, each of the data blocks includes a plurality of data units and each of the data units includes a plurality of bits.

For instance, the step of analyzing the digital data includes: scanning the digital data to generate a plurality of constants including the memory size for storing the digital data and the unique data unit (i.e., the data unit that is not identical to any other data units) of the digital data; generating a plurality of variables according to the plurality of dictionary-based compression algorithms in which the variables include the ratio of a dictionary (e.g., a global dictionary) to total dictionaries; generating at least one derived parameter according to some or all of the constants and variables in which the at least one derived parameter includes the storage size for storing the dictionary; and generating the analysis result according to the plurality of constants, the plurality of variables, and the at least one derived parameter. Since any known or self-defined algorithm could be used to analyze the digital data, people of ordinary skill in the art can generate more reference values (e.g., the bit numbers of coded units, the data unit numbers of data blocks, and/or the storage size for storing the other dictionary/dictionaries) or choose proper reference values to generate the qualified analysis result.

Step S920: generating at least three dictionaries including a first dictionary, a second dictionary and a third dictionary according to the analysis result in which the first, second and third dictionaries are associated with a first dictionary-based compression algorithm, a second dictionary-based compression algorithm and a third dictionary-based compression algorithm respectively, the first dictionary-based compression algorithm is operable to execute compression to a first content of the digital data by a unit range of N data blocks, the second dictionary-based compression algorithm is operable to execute compression to a second content of the digital data by a unit range of M data blocks and the third dictionary-based compression algorithm is operable to execute compression to a third content of the digital data by a unit range of L data block(s), in which the first, second and third contents are different, each of N, M, L is a positive integer not greater than the number of the plurality of data blocks, N is greater than the M, and M is greater than L.

For instance, the first, second and third dictionary-based compression algorithms are global, intermediate, and local dictionary-based compression algorithms respectively. The detail explanation could be found through the description about the aforementioned Table 1.

Figure 10:
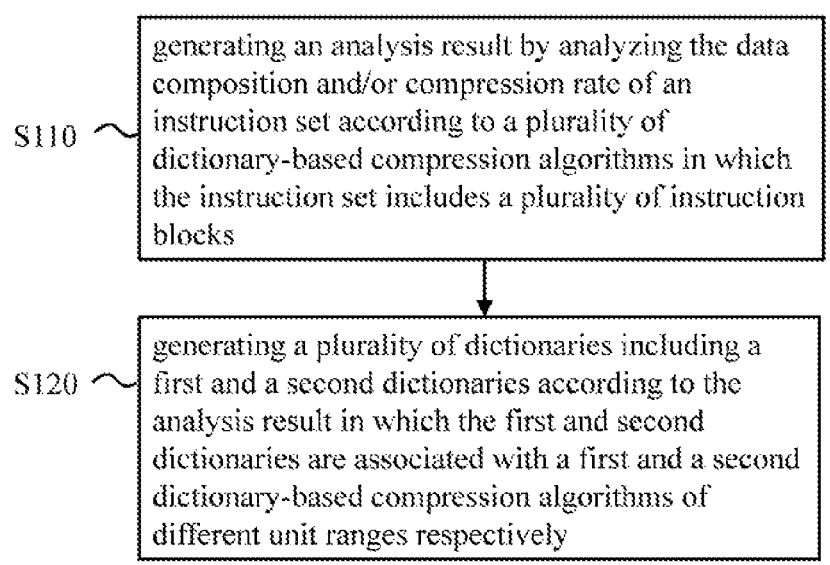
FIG. 10 illustrates an embodiment of the dictionary composing method of the present disclosure applicable to processing an instruction set.

The present disclosure also discloses a dictionary composing method for an MCU instruction set compression or decompression. As shown in FIG. 10, an embodiment of this method comprises:

Step S110: generating an analysis result by analyzing the data composition and/or compression rate of an instruction set according to a plurality of dictionary-based compression algorithms in which the instruction set includes a plurality of instruction blocks, each of the instruction blocks includes a plurality of data units and each of the data units includes a plurality of bits.

For instance, the step of analyzing the instruction set includes: scanning the instruction set to generate a plurality of constants including the memory size for storing the instruction set and the unique data unit (i.e., the data unit that is not identical to any other data units) of the instruction set; generating a plurality of variables according to the plurality of dictionary-based compression algorithms in which the variables include the ratio of a dictionary (e.g., a global dictionary) to total dictionaries; generating at least one derived parameter according to some or all of the constants and variables in which the at least one derived parameter includes the storage size for storing the dictionary; and generating the analysis result according to the plurality of constants, the plurality of variables, and the at least one derived parameter. Similarly, since any known or self-defined algorithm could be used to analyze the instruction set, people of ordinary skill in the art can generate more reference values (e.g., the bit numbers of coded units, the data unit numbers of instruction blocks, an/or the storage size for storing the other dictionary/dictionaries) or choose proper reference values to generate the qualified analysis result.

Step S120: generating a plurality of dictionaries including a first dictionary and a second dictionary according to the analysis result in which the first and second dictionaries are associated with a first dictionary-based compression algorithm and a second dictionary-based compression algorithm respectively, the first dictionary-based compression algorithm is operable to execute compression to a first content of the digital data by a unit range of N data blocks and the second dictionary-based compression algorithm is operable to execute compression to a second content of the digital data by a unit range of M data block(s), in which the first and second contents are different, each of N, M is a positive integer not greater than the number of the plurality of data blocks, and N is greater than M. For example, the first and second dictionary-based compression algorithms are global and intermediate (or local) dictionary-based compression algorithms respectively. The detail explanation could be found through the description about the aforementioned Table 1.

In consideration of that those of ordinary skill in the art can appreciate the implementation detail and alteration by referring to the description of different embodiments, which means that the feature(s) of each embodiment can be applied to any of the other embodiments in a reasonable way, therefore the repeated and redundant explanation is omitted provided that the disclosure and enablement requirements are fulfilled.

In summary, the dictionary-based compression methods, the dictionary-based decompression methods and the dictionary composing methods of the present disclosure make use of a multilayer dictionary, and are applicable to the lossless compression or decompression of digital data or instruction sets. This disclosure is not only capable of lowering cost by reducing the memory size for storage but also capable of starting decompression at the position of any coded unit.

The aforementioned descriptions represent merely the preferred embodiments of the present disclosure, without any intention to limit the scope of the present disclosure thereto. Various equivalent changes, alterations or modifications based on the claims of present disclosure are all consequently viewed as being embraced by the scope of the present disclosure.

What is claimed is:

1. A dictionary-based compression method comprising the following steps:
    receiving digital data including a plurality of data blocks by a micro controller unit (MCU), wherein each of the data blocks includes a plurality of data units, and each of the data units includes a plurality of bits;
    compressing the digital data and generating compressed digital data according to a multilayer dictionary-based compression algorithm by the MCU, in which the multilayer dictionary-based compression algorithm includes a first dictionary-based compression algorithm, a second dictionary-based compression algorithm and a third dictionary-based compression algorithm, wherein the first dictionary-based compression algorithm is operable to execute compression to a first content of the digital data by a unit range of N data blocks, the second dictionary-based compression algorithm is operable to execute compression to a second content of the digital data by a unit range of M data blocks, and the third dictionary-based compression algorithm is operable to execute compression to a third content of the digital data by a unit range of L data block(s), in which the first, second and third contents are different, each of N, M, L is a positive integer not greater than a number of the plurality of data blocks, N is greater than M, and M is greater than L; and
    storing the compressed digital data in a memory circuit.

2. The dictionary-based compression method of claim 1, wherein the first dictionary-based compression algorithm is a global dictionary-based compression algorithm, the second dictionary-based compression algorithm is an intermediate dictionary-based compression algorithm, and the third dictionary-based compression algorithm is a local dictionary-based compression algorithm.

3. The dictionary-based compression method of claim 1, wherein N is equal to the number of the plurality of data blocks, M is less than N but greater than 1, and L is equal to 1.

4. The dictionary-based compression method of claim 1, wherein the first dictionary-based compression algorithm is operable to process at least one of the data units whose occurrence frequency is higher than a first frequency when one data block is taken as a unit range over all of the data blocks, the second dictionary-based compression algorithm is operable to process at least one of the data units whose occurrence frequency is between the first frequency and a second frequency when one data block is taken as a unit range over all of the data blocks, and the third dictionary-based compression algorithm is operable to process at least one of the data units whose occurrence frequency is lower than the second frequency when one data block is taken as a unit range over all of the data blocks.

5. The dictionary-based compression method of claim 4, wherein the third dictionary-based compression algorithm is operable to process at least one of the data units whose occurrence frequency is the highest within the same data block.

6. A dictionary-based compression method operable to compress an instruction set for a micro controller unit (MCU), comprising:
    receiving the instruction set including a plurality of instruction blocks by the MCU, wherein each of the instruction blocks includes a plurality of data units and each of the data units includes a plurality of bits;
    compressing the instruction set and generating a compressed instruction set according to a plurality of dictionary-based compression algorithms by the MCU, in which the dictionary-based compression algorithms include a first dictionary-based compression algorithm and a second dictionary-based compression algorithm, wherein the first dictionary-based compression algorithm is operable to execute compression to a first content of the instruction set by a unit range of N instruction blocks and the second dictionary-based compression algorithm is operable to execute compression to a second content of the instruction set by a unit range of M instruction block(s), wherein the first and second contents are different, each of N, M is a positive integer not greater than the number of the plurality of instruction blocks and N is greater than M;
    storing the compressed instruction set in a memory circuit.

7. The dictionary-based compression method of claim 6, wherein the plurality of dictionary-based compression algorithms further includes: a third dictionary-based compression algorithm executing compression to a third content of the instruction set by a unit range of L instruction blocks, in which the first, second and third contents are different, the L is a positive integer not greater than the number of the plurality of instruction blocks and the L is less than M.

8. The dictionary-based compression method of claim 7, wherein N is equal to the number of the plurality of instruction blocks, M is less than N but greater than 1, and the L is equal to 1.

9. The dictionary-based compression method of claim 7, wherein the first dictionary-based compression algorithm is operable to process at least one of the data units whose occurrence frequency is higher than a first frequency when one instruction block is taken as a unit range over all of the instruction blocks, the second dictionary-based compression algorithm is operable to process at least one of the data units whose occurrence frequency is between the first frequency and a second frequency when one instruction block is taken as a unit range over all of the instruction blocks, and the third dictionary-based compression algorithm is operable to process at least one of the data units whose occurrence frequency is lower than the second frequency when one instruction block is taken as a unit range over all of the instruction blocks.

10. The dictionary-based compression method of claim 6, further comprising:
generating an analysis result by analyzing the data composition and/or compression rate of the instruction set according to the plurality of the dictionary-based compression algorithms,
wherein the step of compressing the instruction set includes: compressing the instruction set with the plurality of dictionary-based compression algorithms according to the analysis result.

11. A dictionary-based decompression method operable to generate an instruction set of a micro controller unit (MCU) through decompression, comprising:
receiving a first program counter value by a memory circuit;
locating a first coded unit according to the first program counter value by the memory circuit, in which the first coded unit pertains to a plurality of coded units that are associated with a plurality of dictionary-based compression algorithms and stored in a compression codes storage unit of the memory circuit;
determining a dictionary start address according to the first coded unit by the memory circuit;
determining a dictionary content address according to a plurality of parameters including the first coded unit and the dictionary start address by the memory circuit; and
accessing a dictionary storage unit of the memory circuit according to the dictionary content address by a selection circuit of the memory circuit to obtain one or more first data units in connection with the first coded unit in which the one or more first data units pertains to the instruction set of the micro controller unit and are stored in the dictionary storage unit.

12. The dictionary-based decompression method of claim 11, wherein the instruction set includes a plurality of instruction blocks, and the plurality of dictionary-based compression algorithms includes a first dictionary-based compression algorithm and a second dictionary-based compression algorithm, wherein the first dictionary-based compression algorithm is operable to execute compression to a first content of the instruction set by a unit range of N data blocks and the second dictionary-based compression algorithm is operable to execute compression to a second content of the instruction set by a unit range of M data block(s), wherein the first and second contents are different, each of N, M is a positive integer not greater than the number of the plurality of instruction blocks, and N is greater than M.

13. The dictionary-based decompression method of claim 11, wherein the plurality of parameters includes: the dictionary start address, the first program counter value, the size of a single data block pertaining to the first coded unit, the size of a single coded block pertaining to the first coded unit, and the first coded unit.

14. The dictionary-based decompression method of claim 11, wherein each of the coded units has the same number of bit(s).

15. The dictionary-based compression method of claim 1, wherein the memory circuit includes a compression codes storage unit storing compression codes of the compressed digital data and a dictionary storage unit storing data units of the compressed digital data.

16. The dictionary-based compression method of claim 1, wherein the storage size necessary for the compressed digital data is less than the storage size necessary for the digital data.

17. The dictionary-based compression method of claim 6, wherein the memory circuit includes a compression codes storage unit storing compression codes of the compressed digital data and a dictionary storage unit storing data units of the compressed digital data.

18. The dictionary-based compression method of claim 6, wherein the storage size necessary for the compressed digital data is less than the storage size necessary for the digital data.

* * * * *